(12) United States Patent
Yen

(10) Patent No.: US 8,376,588 B2
(45) Date of Patent: Feb. 19, 2013

(54) GAIN STRUCTURE OF LED TUBULAR LAMP FOR UNIFORMING LIGHT AND DISSIPATING HEAT

(76) Inventor: Hsu Li Yen, Taipei County (TW)

( * ) Notice: Subject to any disclaimer, the term of this patent is extended or adjusted under 35 U.S.C. 154(b) by 82 days.

(21) Appl. No.: 12/951,340

(22) Filed: Nov. 22, 2010

(65) Prior Publication Data

US 2012/0127726 A1 May 24, 2012

(51) Int. Cl.
*F21V 29/00* (2006.01)
(52) U.S. Cl. .......................................... 362/294
(58) Field of Classification Search ................. 362/294, 362/547
See application file for complete search history.

(56) References Cited

U.S. PATENT DOCUMENTS

| | | | |
|---|---|---|---|
| 2005/0152146 A1* | 7/2005 | Owen et al. | 362/294 |
| 2007/0152561 A1* | 7/2007 | Ono et al. | 313/485 |
| 2009/0294780 A1* | 12/2009 | Chou et al. | 257/88 |

* cited by examiner

*Primary Examiner* — Anh Mai
*Assistant Examiner* — Hana Featherly
(74) *Attorney, Agent, or Firm* — Rosenberg, Klein & Lee

(57) ABSTRACT

A gain structure of an LED tubular lamp for uniforming light and dissipating heat is disclosed. The gain structure allows the LED tubular lamp to give out even illuminance without eye-offending peak illuminance of LED chips. The LED tubular lamp has an illuminator, which includes a substrate equipped with spaced LED chips, wherein the LED chips are arranged in a density equal to or greater than 2 chips/cm$^2$, so that the LED chips illuminate through the frosted housing jointly present pleasing, uniform illuminance. The substrate is provided with metal sheets serving to absorb heat generated by the LED chips that are illuminating, so as to accelerate heat dissipation and thereby prevent the LED chips from premature aging that degrade their brightness.

1 Claim, 4 Drawing Sheets

GAIN STRUCTURE OF LED TUBULAR LAMP FOR UNIFORMING LIGHT AND DISSIPATING HEAT

BACKGROUND OF THE INVENTION

1. Technical Field

The present invention relates to LED lamps, and more particularly, to a gain structure of an LED tubular lamp for uniforming light and dissipating heat.

2. Description of Related Art

For meeting the requirements of environmental protection and energy preservation, LED chips have gradually replaced traditional light bulbs and tubes. Referring to FIG. 1, there is an LED tubular lamp 100 currently available on the market. Such an existing LED tubular lamp 100 illuminates depending on a substrate provided with a plurality of LED chips 10 and covered by a transparent housing 20. However, the conventional structure fails to uniform the light, as shown in FIG. 1, so each of the LED chips 10 has its center presenting peak illuminance and thus only dimmed light presented at borders between adjacent two said LED chips 10. Consequently, the overall illuminance of the LED tubular lamp 100 is uneven. In addition, when illuminating, the LED chips 10 generate high heat that may bring premature aging and damage to the LED chips 10.

In view that the uneven illuminance is eye-offending, the inventor of the present invention, after numerous researches and tests targeting the problem, eventually invented a refined structure that makes an LED tubular lamp give out pleasing, uniform illuminance.

SUMMARY OF THE INVENTION

The present invention provides a gain structure of an LED tubular lamp for uniforming light and dissipating heat. The gain structure allows the LED tubular lamp to give out even illuminance without eye-offending peak illuminance of LED chips. The LED tubular lamp has an illuminator, which includes a substrate equipped with spaced LED chips, wherein the LED chips are arranged in a density equal to or greater than 2 chips/cm$^2$, so that the LED chips illuminate through the frosted housing jointly present pleasing, uniform illuminance. The substrate is provided with metal sheets serving to absorb heat generated by the LED chips that are illuminating, so as to accelerate heat dissipation and thereby prevent the LED chips from premature aging that degrade their brightness.

The objective of the present invention is to realize uniform illuminance and accelerate heat dissipation.

BRIEF DESCRIPTION OF THE DRAWINGS

The invention as well as a preferred mode of use, further objectives and advantages thereof will be best understood by reference to the following detailed description of an illustrative embodiment when read in conjunction with the accompanying drawings, wherein.

DETAILED DESCRIPTION OF THE INVENTION

Figure 1:
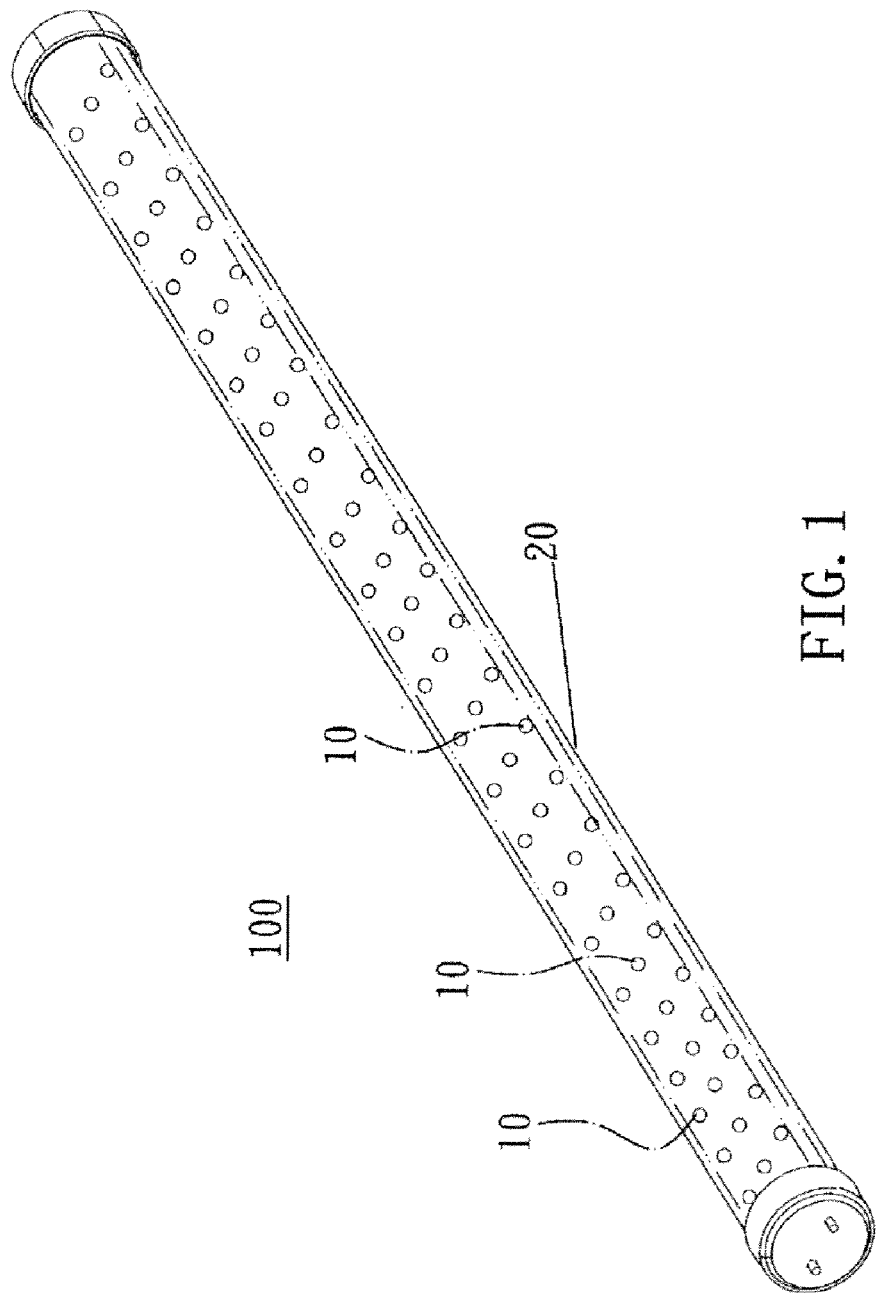
FIG. 1 is a schematic drawing showing a conventional LED tubular lamp presenting uneven illuminance.
Figure 2:
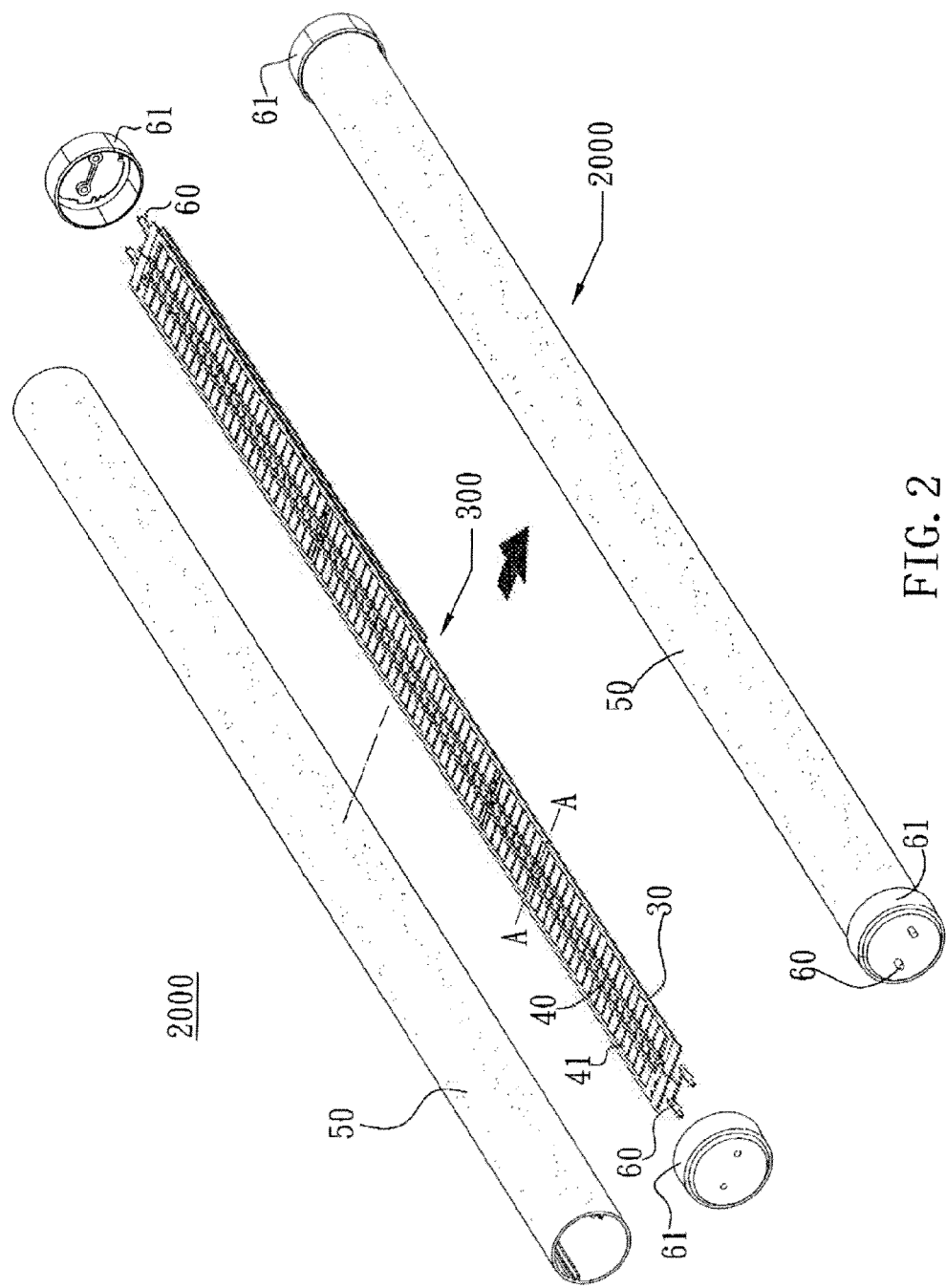
FIG. 2 provides an exploded view and an assembled view of a gain structure of an LED tubular lamp for uniforming light and dissipating heat according to the present invention.

FIG. 2 provides an exploded view and an assembled view of a gain structure of an LED tubular lamp for uniforming light and dissipating heat according to the present invention. As shown, also referring to FIG. 3, an illuminator 300 having a substrate 30 equipped with spaced LED chips 40 is housed by a frosted housing 50, wherein the substrate 30 is distally provided with connecting ends 60 and end caps 61, so as to construct an LED tubular lamp 2000.

Therein, the LED chips 40 on the substrate 30 are arranged in a density equal to or greater than 2 chips/cm$^2$. The LED chips 40 illuminate through the frosted housing 50 can jointly present pleasing, uniform illuminance, as shown in FIG. 4.

Figure 3:
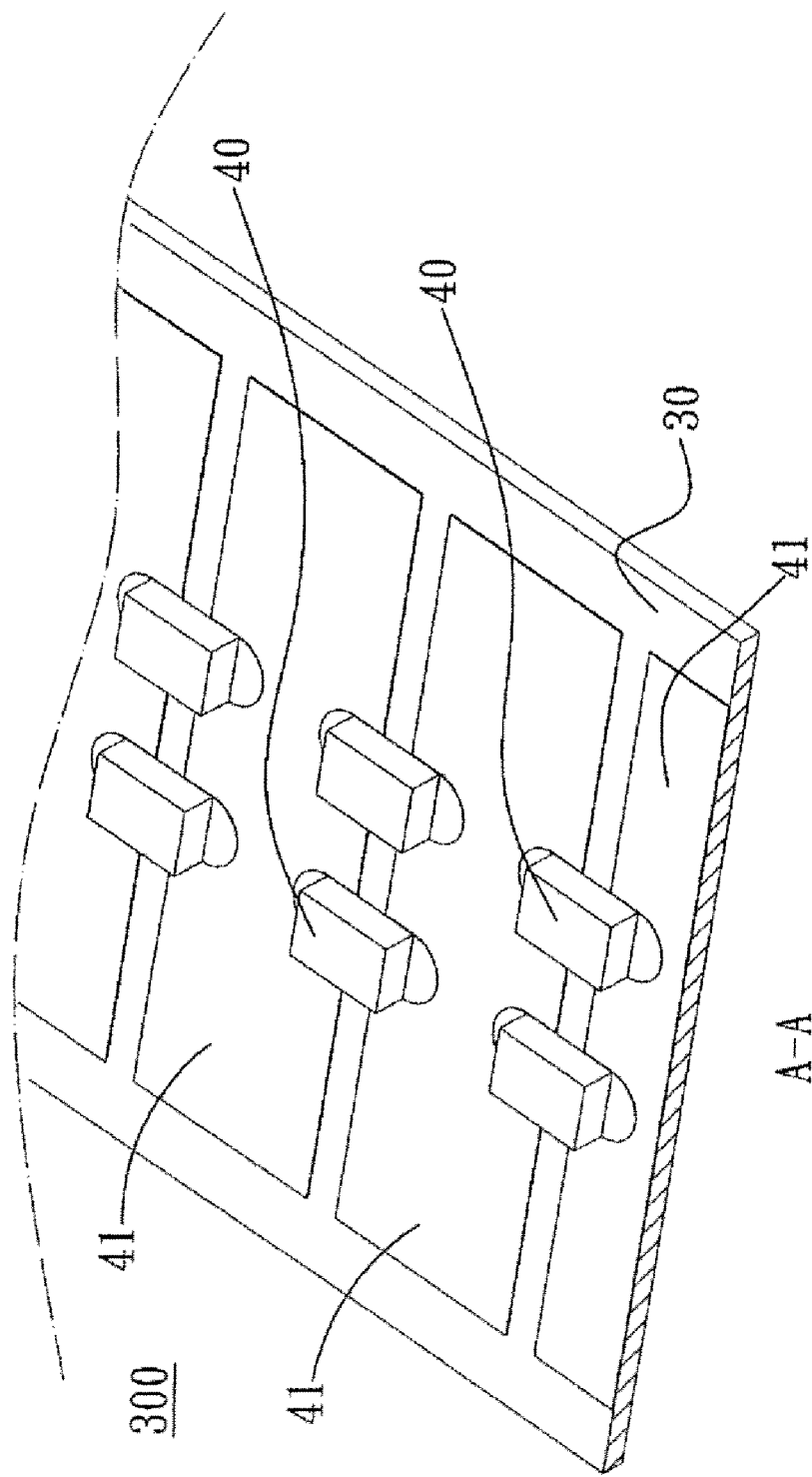
FIG. 3 is a cross-sectional view of an illuminator taken along Line A-A of FIG. 2.

FIG. 3 is a cross-sectional view of the illuminator 300 taken along Line A-A of FIG. 2. As shown, the substrate 30 has its surface affixed with metal sheets 41, which serve to absorb heat generated by the LED chips 40 that are illuminating, so as to accelerate heat dissipation and thereby prevent the LED chips from premature aging that degrade their brightness.

Figure 4:
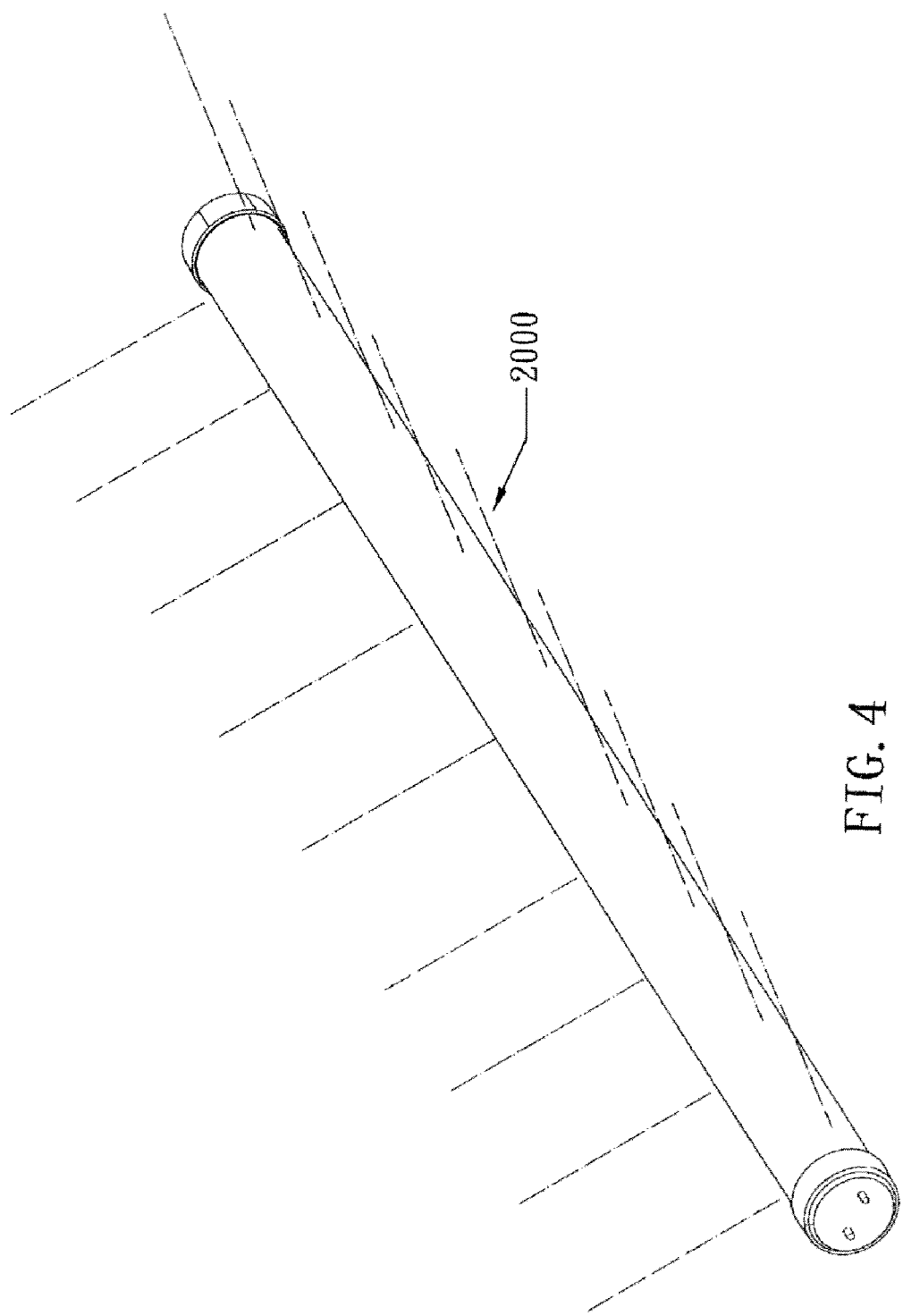
FIG. 4 is a schematic drawing showing the LED tubular lamp of the present invention giving out uniform illuminance.

FIG. 4 is a schematic drawing showing the LED tubular lamp of the present invention giving out uniform illuminance. As shown, the LED tubular lamp 2000 of the present invention can give out uniform illumination that is gentle and not eye-offending.

The present invention has been described with reference to the preferred embodiment and it is understood that the embodiment is not intended to limit the scope of the present invention. Moreover, as the contents disclosed herein should be readily understood and can be implemented by a person skilled in the art, all equivalent changes or modifications which do not depart from the concept of the present invention should be encompassed by the appended claim.

What is claimed is:

1. A gain structure of an LED tubular lamp for uniforming light and dissipating heat, comprising:
    an illuminator including a partition-free substrate equipped with a plurality of LED chips;
    a frosted housing, the substrate having distally connecting ends and end caps, thereby forming the LED tubular lamp; and
    a plurality of metal sheets formed on a planar surface of the substrate, each of the LED chips being coupled to extend between adjacent pairs of the metal sheets, the metal sheets absorbing heat generated by the LED chips during illumination to thereby accelerate heat dissipation and prevent the LED chips from premature aging and degraded brightness;
    wherein, the LED chips on the substrate are arranged in a density equal to or greater than 2 chips/cm$^2$, whereby the LED chips illuminate through the frosted housing jointly presenting pleasing, uniform illuminance.

* * * * *